(12) United States Patent
Rosendale et al.

(10) Patent No.: US 10,700,280 B2
(45) Date of Patent: *Jun. 30, 2020

(54) FORMING AND OPERATING MEMORY DEVICES THAT UTILIZE CORRELATED ELECTRON MATERIAL (CEM)

(71) Applicant: Arm Limited, Cambridge (GB)

(72) Inventors: Glen Arnold Rosendale, Palo Alto, CA (US); Lucian Shifren, San Jose, CA (US)

(73) Assignee: Arm Limited, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 16/459,518

(22) Filed: Jul. 1, 2019

(65) Prior Publication Data
US 2019/0334086 A1 Oct. 31, 2019

Related U.S. Application Data

(63) Continuation of application No. 15/610,288, filed on May 31, 2017, now Pat. No. 10,340,453.

(51) Int. Cl.
*G11C 11/00* (2006.01)
*H01L 45/00* (2006.01)
(Continued)

(52) U.S. Cl.
CPC ...... *H01L 45/1616* (2013.01); *G11C 13/0002* (2013.01); *G11C 13/003* (2013.01); *G11C 13/004* (2013.01); *G11C 13/0069* (2013.01); *H01L 27/2409* (2013.01); *H01L 27/2463* (2013.01); *H01L 45/10* (2013.01); *H01L 45/122* (2013.01); *H01L 45/1253* (2013.01); *H01L 45/147* (2013.01); *H01L 45/1633* (2013.01); *H01L 45/1641* (2013.01); *G11C 13/0004* (2013.01); *G11C 2013/0045* (2013.01); *G11C 2013/0078* (2013.01); *G11C 2213/15* (2013.01); *G11C 2213/71* (2013.01);
(Continued)

(58) Field of Classification Search
CPC ............ G11C 13/0002; G11C 13/0004; G11C 13/003
USPC ......................................................... 365/148
See application file for complete search history.

(56) References Cited

U.S. PATENT DOCUMENTS 7,298,640 B2   11/2007   Chen et al.
7,639,523 B2   12/2009   Celinska et al.
(Continued)

OTHER PUBLICATIONS

Notification of Transmittal of the International Search Report and the Written Opinion of the International Searching Authority, or the Declaration, dated Nov. 2, 2018, International Application No. PCT/GB2018/051457, 1 pg.
(Continued)

*Primary Examiner* — Huan Hoang
(74) *Attorney, Agent, or Firm* — Berkeley Law & Technology Group, LLP

(57) ABSTRACT

Subject matter disclosed herein may relate to fabrication of correlated electron materials (CEMs) devices used, for example, to read from a resistive memory element or to write to a resistive memory element. In embodiments, by limiting current flow through a CEM device, the CEM device may operate in the absence of Mott and/or Mott-like transitions in a way that brings about symmetrical diode-like operation of the CEM device.

20 Claims, 6 Drawing Sheets

(51) Int. Cl.
*G11C 13/00* (2006.01)
*H01L 27/24* (2006.01)

(52) U.S. Cl.
CPC ...... *G11C 2213/72* (2013.01); *G11C 2213/73* (2013.01); *H01L 45/04* (2013.01); *H01L 45/146* (2013.01)

(56) References Cited

U.S. PATENT DOCUMENTS

| | | | |
|---|---|---|---|
| 7,778,063 | B2 | 8/2010 | Brubaker et al. |
| 7,872,900 | B2 | 1/2011 | Paz De Araujo et al. |
| 9,558,819 | B1 | 1/2017 | Aitken et al. |
| 9,584,118 | B1 | 2/2017 | Dao et al. |
| 9,589,636 | B1 | 3/2017 | Bhavnagarwala et al. |
| 9,627,615 | B1 | 4/2017 | Reid et al. |
| 10,340,453 | B2 * | 7/2019 | Rosendale ............... H04L 45/10 |
| 2008/0106926 | A1 * | 5/2008 | Brubaker ............ H01L 27/2409 365/148 |
| 2008/0107801 | A1 | 5/2008 | Celinska et al. |
| 2011/0317470 | A1 | 12/2011 | Lu et al. |
| 2012/0305879 | A1 | 12/2012 | Lu et al. |
| 2012/0311407 | A1 * | 12/2012 | Lee .................... G06F 11/1048 714/768 |
| 2013/0200323 | A1 | 8/2013 | Pham et al. |
| 2013/0214232 | A1 | 8/2013 | Tendulkar et al. |
| 2013/0285699 | A1 | 10/2013 | McWilliams et al. |
| 2013/0308369 | A1 | 11/2013 | Lu et al. |
| 2016/0163978 | A1 | 6/2016 | Paz De Araujo et al. |
| 2017/0033782 | A1 | 2/2017 | Shifren et al. |
| 2017/0045905 | A1 | 2/2017 | Sandhu et al. |
| 2017/0047116 | A1 | 2/2017 | Sandhu et al. |
| 2017/0047919 | A1 | 2/2017 | Sandhu et al. |
| 2017/0069378 | A1 | 3/2017 | Shifren et al. |
| 2017/0178718 | A1 * | 6/2017 | Savanth ............... G11C 13/004 |

OTHER PUBLICATIONS

International Search Report, dated Nov. 2, 2018, International Application No. PCT/GB2018/051457, 7 pgs.
Written Opinion of the International Searching Authority, dated Nov. 2, 2018, International Application No. PCT/GB2018/051457, 14 pgs.
Partial Search Report, dated Sep. 10, 2018, International Application No. PCT/GB2018/051457, 17 pgs.
U.S. Appl. No. 15/610,288, filed May 31, 2017, 73 pgs.
Filing Receipt, mailed Jun. 13, 2017, U.S. Appl. No. 15/610,288, 3 pgs.
Notice of Publication of Application, U.S. Appl. No. 15/610,288, 1 pg.
Non-Final Office Action, dated Dec. 28, 2017, U.S. Appl. No. 15/610,288, 20 pgs.
Response to Non-Final Office Action, filed Mar. 29, 2019, U.S. Patent Application No. 15/610,288, 16 pgs.
Non-Final Office Action, dated Jul. 31, 2018, U.S. Appl. No. 15/610,288, 19 pgs.
Response to Non-Final Office Action, filed Oct. 30, 2018, U.S. Appl. No. 15/610,288, 20 pgs.
Notice of Allowance, dated Feb. 13, 2019, U.S. Appl. No. 15/610,288, 13 pgs.
Issue Fee Payment and Rule 312 Amendment, filed May 10, 2019, U.S. Appl. No. 15/610,288, 13 pgs.
Response to Rule 312 Amendment, dated May 30, 2019, U.S. Appl. No. 15/610,288, 2 pgs.
Notice of Non-Compliant IDS, mailed May 22, 2019, U.S. Appl. No. 15/610,288, 1 pg.
Issue Notification, mailed Jun. 12, 2019, U.S. Appl. No. 15/610,288, 1 pg.
Notification Concerning Transmittal of International Preliminary Report on Patentability, International Application No. PCT/GB2018/051457, dated Dec. 12, 2019, 1 pg.
International Preliminary Report on Patentability, International Application No. PCT/GB2018/051457, dated Dec. 12, 2019, 13 pgs.

* cited by examiner

900

910

Apply a voltage signal to a CEM devices in series with a first terminal and a second terminal of a resistive memory element

920

Limit electrical current flow through the CEM device to bring about operation of the CEM device in a region of an impedance profile that is absent a Mott or Mott-like transition when the CEM device is operating to write to the resistive memory element and when the CEM device is operating to read from the resistive memory element

Form one or more resistive memory elements having first terminals and second terminals

1020

Form a CEM device to be coupled in series with at least one of the one or more resistive memory elements, the CEM device to operate to perform read operations or write operations in a region of an impedance profile that is absent a Mott or Mott-like transition during the read operations or the write operations of the at least one of the one or more resistive memory elements

*FIG. 10*

FORMING AND OPERATING MEMORY DEVICES THAT UTILIZE CORRELATED ELECTRON MATERIAL (CEM)

RELATED APPLICATIONS

This application is a continuation of U.S. patent application Ser. No. 15/610,288 entitled "FORMING AND OPERATING MEMORY DEVICES THAT UTILIZE CORRELATED ELECTRON MATERIAL (CEM)," filed May 31, 2017, and is incorporated herein by reference in its entirety.

BACKGROUND

Field

This disclosure relates to devices formed from correlated electron materials (CEMs), and may relate, more particularly, to approaches toward forming and operating memory devices coupled to CEM devices.

Information

Integrated circuit devices, such as electronic switching devices, for example, may be found in a wide range of electronic device types. For example, memory and/or logic devices may incorporate electronic switches suitable for use in computers, digital cameras, smart phones, tablet devices, personal digital assistants, and so forth. Factors that relate to electronic switching devices, which may be of interest to a designer in considering whether an electronic switching device is suitable for a particular application, may include physical size, storage density, operating voltages, impedance ranges, and/or power consumption, for example. Other factors that may be of interest to designers may include, for example, cost of manufacture, ease of manufacture, scalability, and/or reliability. Moreover, there appears to be an ever-increasing need for memory and/or logic devices that exhibit characteristics of lower power and/or higher speed. A need for lower power and/or higher speed devices may involve a number of device types, which may, for example, include devices fabricated, for example, at the front end of line (FEOL) or at the back end of line (BEOL) of a wafer fabrication process.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIGS. 9-10 are flowcharts for methods of operating memory devices using a CEM according to embodiments.

Figure 1A:
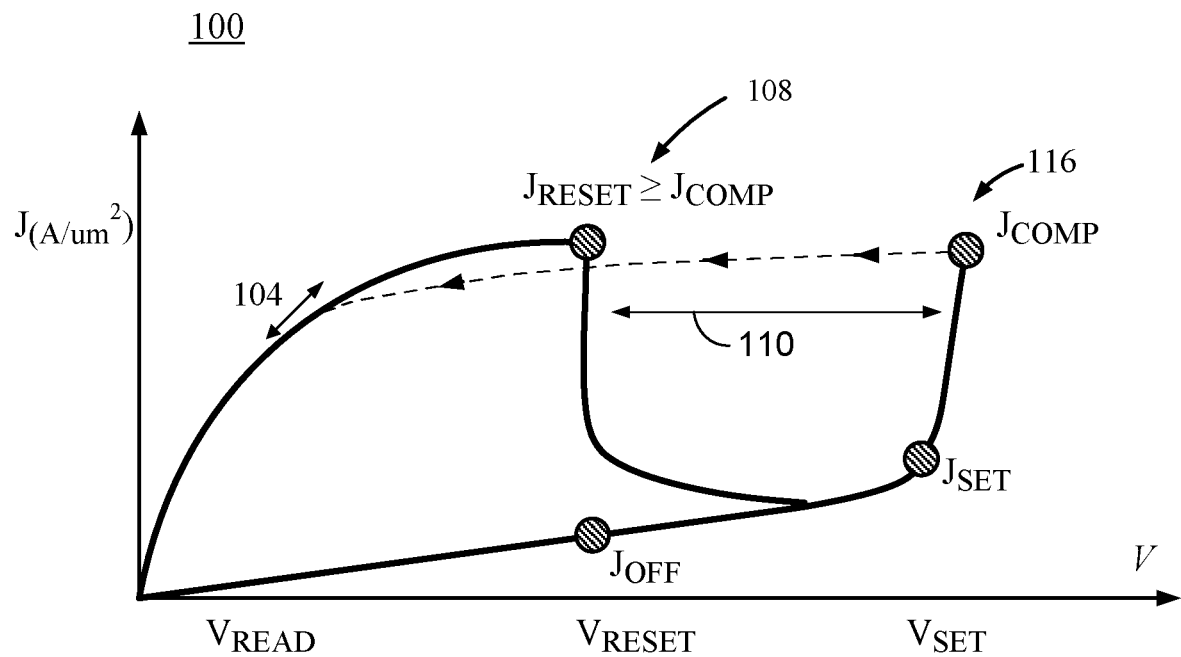
FIG. 1A is a graphical representation of an impedance profile of a device formed from a CEM according to an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing, fabricating, and/or operating CEM devices and/or other circuit elements, such as may be utilized to form a memory element comprising a CEM, for example, in a series arrangement with a resistive memory element. CEMs, which may be utilized in the construction memory system comprising CEM devices, for example, may also comprise a wide range of other electronic circuit types, such as, for example, memory access devices, memory controllers, memory arrays, filter circuits, data converters, optical instruments, phase locked loop circuits, microwave and millimeter wave components, and so forth, although claimed subject matter is not limited in scope in these respects. In this context, a CEM device, for example, may exhibit a substantially rapid conductor-to-insulator transition, which may be brought about by electron correlations rather than solid state structural phase changes, such as in response to a change from a crystalline to an amorphous state, for example, in a phase change memory device or, in another example, formation of filaments in phase change memory (PCM) devices. In one aspect, a substantially rapid conductor-to-insulator transition in a CEM device may be responsive to a quantum mechanical phenomenon, in contrast to melting/solidification or filament formation, for example, in phase change memory devices. Such quantum mechanical transitions between relatively conductive and relatively insulative states, and/or between first and second impedance states, for example, in a CEM device may be understood in any one of several aspects. As used herein, the terms "relatively conductive state," "relatively lower impedance state," and/or "metal state" may be interchangeable, and/or may, at times, be referred to as a "relatively conductive/lower impedance state." Similarly, the terms "relatively insulative state" and "relatively higher impedance state" may be used interchangeably herein, and/or may, at times, be referred to as a relatively "insulative/higher impedance state."

In an aspect, a quantum mechanical transition of a correlated electron material between a relatively insulative/higher impedance state and a relatively conductive/lower impedance state, wherein the relatively conductive/lower impedance state is substantially dissimilar from the insulated/higher impedance state, may be understood in terms of a Mott transition. In accordance with a Mott transition, a material may transition (e.g., turn-on) from a relatively insulative/higher impedance state to a relatively conductive/lower impedance state. The Mott criteria may be defined by $(n_c)^{1/3} a \approx 0.26$, wherein $n_c$ denotes a concentration of electrons, and wherein "a" denotes the Bohr radius. If a threshold carrier concentration is achieved, such that the Mott criteria is met, the Mott transition is believed to occur. Thus, in this context, a "Mott transition" may comprise a transition of the state of a CEM from a relatively higher resistance/higher capacitance state (e.g., an insulative/higher impedance state) to a relatively lower resistance/lower capacitance state (e.g., a conductive/lower impedance state) that is substantially dissimilar from the higher resistance/higher capacitance state. Likewise, in this context, a "Mott-like transition" may comprise a transition of the state of a CEM changing from a relatively lower resistance/lower capacitance state (e.g., a conductive/lower impedance state) to a relatively higher resistance/higher capacitance state (e.g., an insulative/higher impedance state). Accordingly, in this context, a "Mott or Mott-like transition" occurring in a device, as referred to herein, means an abrupt change in localization of electrons, which affects an impedance of the device. This may include, for example, conditions in a device giving rise to a set operation to place the device in a low impedance or conductive state or giving rise to a reset operation to place the device in a high impedance or insulative state as described above.

Hence, a Mott transition may be brought about if carriers, such as electrons, for example, are localized so as to give rise to a strong coulomb interaction between the carriers. Such strong coulomb interaction is believed to split the bands of the CEM to bring about a relatively insulative (relatively higher impedance) state. If electrons are no longer localized, a weak coulomb interaction may dominate, which may give rise to a removal of band splitting, which may, in turn, bring about a metal (conductive) band (relatively lower impedance state) that is substantially dissimilar from the relatively higher impedance state.

Further, in an embodiment, a transition from a relatively insulative/higher impedance state to a substantially dissimilar and relatively conductive/lower impedance state may bring about a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and therefore may exhibit a substantially low capacitance, which may likewise approach zero.

Similarly, in a relatively insulative/higher impedance state, which may be brought about by a higher density of bound or correlated electrons, an external electric field may be capable of penetrating the CEM and, therefore, the CEM may comprise higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may comprise switching of impedance states responsive to a Mott or Mott-like transition in a majority of the volume of the CEM comprising a CEM-based device. In an embodiment, a CEM device may form a "bulk switch." As used herein, the term "bulk switch" refers to at least a majority volume of a CEM switching a device's impedance state, such as in response to a Mott or Mott-like transition. For example, in an embodiment, substantially all CEM of a device may switch from a relatively insulative/higher impedance state to a relatively conductive/lower impedance state (Mott transition) or from a relatively conductive/lower impedance state to a relatively insulative/higher impedance state (Mott-like transition).

In implementations, a CEM device may comprise one or more "d-block" elements from of the periodic table of the elements, such as transition metals, transition metal compounds, one or more transition metal oxides (TMOs), for example. CEM devices may also be implemented utilizing one or more "f-block" elements of the periodic table of the elements, such as rare earth elements, oxides of rare earth elements, oxides comprising one or more rare earth transitional metals, perovskites, yttrium, and/or ytterbium, or any other compounds comprising metals from the lanthanide or actinide series of the periodic table of the elements, for example, and claimed subject matter is not limited in scope in this respect. Accordingly, in embodiments, a CEM device may comprise oxides of one or more d-block elements and/or oxides of one or more f-block elements, having an atomic concentration of at least 85.0%, for example, with the remaining portion of the CEM device comprising a dopant such as, for example, carbon or nitrogen. Thus, in this context, as the term is used herein, a d-block element means an element comprising Scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg), rutherfordium (Rf), dubnium (Db), seaborgium (Sg), bohrium (Bh), hassium (Hs), meitnerium (Mt), darmstadtium (Ds), roentgenium (Rg) or copernicium (Cn), or any combination thereof. Also in this context, a CEM device formed from or comprising an "f-block" element of the periodic table of the elements means a CEM device comprising a metal or metal oxide from f-block of the periodic table of the elements, which includes lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), neptunium (Np), plutonium (Pu), americium (Am), berkelium (Bk), californium (Cf), einsteinium (Es), fermium (Fm), mendelevium (Md), nobelium (No) or lawrencium (Lr), or any combination thereof.

However, in particular embodiments, a Mott transition, indicating an abrupt change from a relatively higher resistance/higher capacitance state (e.g., an insulative/higher impedance state) to a relatively lower resistance/lower capacitance state (e.g., a conductive/lower impedance state) or a Mott-like transition, indicating an abrupt change from a conductive/lower impedance state to an insulative/higher impedance state, for example, may be inhibited from occurring in a CEM device. For example, for a CEM device operating in a low-impedance state, responsive to current limiting by, for example, an external circuit element, such as a resistive memory element, may operate to limit and/or constrain a concentration of electrons that may be available to flow through the CEM device. In one embodiment, an additional resistor (or other type of current-limiting element) may be disposed in series with a CEM device coupled to a resistive memory element to limit a quantity of electrons capable of flowing through the CEM device. In another embodiment, current limiting within a CEM device may be achieved by selecting a dopant type and atomic concentration, which may limit a number of available carriers (e.g., holes or electrons) sufficient to bring about a Mott or Mott-like transition. In an embodiment, reduction of an atomic concentration of available holes may be achieved by utilizing an n-type dopant, which may render a material n-type and, accordingly, may inhibit hole-induced Mott or Mott-like transitions. Accordingly, the Mott transition, previously defined herein as being in response to $(n_c)^{1/3}a \approx 0.26$, (wherein $n_c$ denotes a concentration of electrons, and wherein "a" denotes the Bohr radius) may, for example, prohibited from occurring. As described in detail herein, such inhibiting, or at least restricting, of a Mott transition may permit a CEM device to operate in an absence of either a Mott transition or a Mott-like transition. As described in reference to FIG. 1A, "a region of an impedance profile that is absent Mott or Mott-like transition" corresponds to the region of the current density versus voltage profile that includes points $J_{OFF}$, $J_{SET}$, and $J_{COMP}$ (of FIG. 1A). It should be noted that additional approaches toward inhibiting Mott or Mott-like transitions may be utilized, and claimed subject matter is not limited in this respect.

FIG. 1A is a graphical representation of an impedance profile of a device formed from a CEM according to an embodiment 100. Based, at least in part, on a voltage applied to terminals of a CEM device, for example, the CEM device may be placed into a relatively low-impedance state or a relatively high-impedance state. For example, application of a voltage $V_{SET}$ and a current density $J_{SET}$ may bring about a transition of the CEM device to a relatively low-impedance memory state. In this context, $V_{SET}$ corresponds to a "turn-on" voltage, which means a voltage level at which a CEM device transitions from a high-impedance state to a low-impedance state. Conversely, application of a voltage $V_{RESET}$ and a current density $J_{RESET}$ may bring about a transition of the CEM device to a relatively high-impedance memory state. As shown in FIG. 1A, reference designator 110 illustrates the voltage range that may separate $V_{RESET}$ from $V_{SET}$.

In accordance with FIG. 1A, if a voltage signal at a sufficient level is applied (e.g., exceeding a band-splitting potential) and the aforementioned Mott condition is satisfied (e.g., injected electron holes are of a population comparable to a population of electrons in a switching region, for example), a CEM device may transition from a relatively low-impedance state to a relatively high-impedance state. This may correspond to point 108 of the voltage versus current density profile of FIG. 1A. At, or suitably near this point, electrons are no longer screened and become localized near metal ions of the CEM formed within the CEM device. This correlation may result in a strong electron-to-electron interaction potential, which may operate to split the bands to form a relatively high-impedance material. If the CEM device comprises a relatively high-impedance state, current may be generated by transportation of electron holes. In certain embodiments, injection of a threshold current of electrons, at a threshold potential applied across terminals of a CEM device, may perform a "set" operation, which places the CEM device into a low-impedance state. In a low-impedance state, an increase in electrons may screen incoming electrons and remove a localization of electrons, which may operate to collapse the band-splitting potential, thereby giving rise to the low-impedance state.

According to an embodiment, current in a CEM device may be controlled by an externally applied "compliance" condition, which may be determined at least partially on the basis of an applied external current, which may be limited during an operation to place the CEM device into a relatively high-impedance state. This externally applied compliance current may, in some embodiments, also set a condition of a current density for a subsequent reset operation to place the CEM device into a relatively high-impedance state. As shown in the particular implementation of FIG. 1A, a current density $J_{COMP}$, which may be applied during an operation at point 116 to place the CEM device into a relatively high-impedance state, may determine a compliance condition for placing the CEM device into a low-impedance state in a subsequent operation. As shown in FIG. 1A, the CEM device may be subsequently placed into a low-impedance state by application of a current density $J_{RESET} \geq J_{COMP}$ at a voltage $V_{RESET}$ at point 108, at which $J_{COMP}$ is externally applied.

In particular embodiments, points 108 and point 116 indicate Mott and Mott-like transitions, respectively, in a CEM device. For example, in accordance with FIG. 1A point 108 represents a feature on the voltage versus current density profile of FIG. 1A at which current density abruptly transitions from a relatively unchanging relationship between the applied voltage and current density (e.g., relatively flat) to a steep drop in current at the applied voltage $V_{RESET}$. In another example, point 116 represents a feature on the voltage versus current density profile of FIG. 1A at which an increasing applied voltage may give rise to a relatively large current flow. At point 116, voltage may be reduced to accord with an abrupt transition of the CEM device from a high-impedance state to a low-impedance state, such as at region 104.

As pointed out above, a reset condition may occur in response to a Mott transition at point 108. As pointed out above, such a Mott transition may bring about a condition in a CEM device in which a concentration of electrons n approximately equals, or becomes at least comparable to, a concentration of electron holes p. This condition may be modeled substantially in accordance with expression (1) as follows:

$$\lambda_{TF} n^{\frac{1}{3}} = C \sim 0.26 \tag{1}$$
$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device. Here, injection of holes may meet a Mott transition criterion for the low-impedance state to high-impedance state transition at current $I_{MI}$ as a threshold voltage $V_{MI}$ is applied across terminals of a CEM device. This may be modeled substantially in accordance with expression (2) as follows:

$$I_{MI}(V_{MI}) = \frac{dQ(V_{MI})}{dt} \approx \frac{Q(V_{MI})}{t} \tag{2}$$
$$Q(V_{MI}) = qn(V_{MI})$$

Wherein $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled substantially in accordance with expression (3), as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \tag{3}$$

-continued
$$J_{reset}(V_{MI}) = J_{MI}(V_{MI}) = \frac{I_{MI}(V_{MI})}{A_{CEM}} = \frac{q}{A_{CEM}t} = \frac{q}{A_{CEM}t}\left(\frac{C}{\lambda_{TF}}\right)^3$$

In which $A_{CEM}$ is a cross-sectional area of a CEM device; and $J_{RESET}$ ($V_{MI}$) may represent a current density through the CEM device to be applied to the CEM device at a threshold voltage $V_{MI}$, which may place the CEM device into a relatively high-impedance state.

According to an embodiment, the CEM device characterized in FIG. 1A, and in other figures herein, may comprise any transition metal oxide (TMO), such as, for example, perovskites, Mott insulators, charge exchange insulators, and Anderson disorder insulators. In particular implementations, a CEM device may be formed from switching materials, such as nickel oxide, cobalt oxide, iron oxide, yttrium oxide, titanium yttrium oxide, and perovskites, such as chromium doped strontium titanate, lanthanum titanate, and the manganate family including praseodymium calcium manganate, and praseodymium lanthanum manganite, just to provide a few examples. In particular, oxides incorporating elements with incomplete "d" and "f" orbital shells, such as those listed above, may comprise sufficient impedance switching properties for use in a CEM device. Other implementations may employ other transition metal compounds without deviating from claimed subject matter.

In one aspect, the CEM devices characterized in FIG. 1A, and in other figures herein, may comprise other types of transition metal oxide variable impedance materials, though it should be understood that these are exemplary only and are not intended to limit claimed subject matter. Nickel oxide (NiO) is disclosed as one particular TMO. NiO materials discussed herein may be doped with extrinsic ligands, such as carbonyl (CO), which may establish and/or stabilize variable impedance properties and/or bring about a P-type operation in which a CEM device may be more conductive in a low-impedance state (e.g., region 104 of FIG. 1A). Thus, in another particular example, NiO doped with extrinsic ligands may be expressed as $NiO:L_x$, where $L_x$ may indicate a ligand element or compound and x may indicate a number of units of the ligand for one unit of NiO. A value of x may be determined for any specific ligand and any specific combination of ligand with NiO or with any other transition metal compound simply by balancing valences. Other dopant ligands, which may bring about or enhance conductivity in a low-impedance state in addition to carbonyl may include: nitrosyl (NO), triphenylphosphine ($PPH_3$), phenanthroline ($C_{12}H_8N_2$), bipyridine ($C_{10}H_8N_2$), ethylenediamine ($C_2H_4(NH_2)_2$), ammonia ($NH_3$), acetonitrile ($CH_3CN$), Fluoride (F), Chloride (Cl), Bromide (Br), cyanide (CN), sulfur (S), and others.

In this context, a "P-type" doped CEM device as referred to herein means a first type of CEM comprising a particular molecular dopant that comprises increased electrical conductivity, relative to an undoped CEM, if the CEM device is operated in a low-impedance state, such as the low-impedance state indicated by region 104 of FIG. 1A. Introduction of a substitutional ligand, such as CO and $NH_3$, may operate to enhance the P-type nature of a NiO CEM. Accordingly, an attribute of P-type operation of a CEM device may include, at least in particular embodiments, an ability to tailor or customize electrical conductivity of a CEM, operated in a low-impedance state, by controlling an atomic concentration of a P-type dopant in a CEM. In particular embodiments, an increased atomic concentration of a P-type dopant may bring about increased electrical conductivity of a CEM, although claimed subject matter is not limited in this respect.

In another embodiment, the CEM device characterized by FIG. 1A may comprise other transition metal oxide variable impedance materials, having an atomic concentration of at least 85.0%, for example, with the remaining portion of the CEM comprising a dopant such as, for example, carbon or nitrogen (or nitrogen-containing or carbon-containing ligands), though it should be understood that these are exemplary only and are not intended to limit claimed subject matter. Nickel oxide (NiO) is disclosed as one particular TMO. NiO materials discussed herein may be doped with extrinsic nitrogen-containing ligands, which may stabilize variable impedance properties. In particular, NiO variable impedance materials disclosed herein may include nitrogen-containing molecules of the form $C_xH_yN_z$ (wherein x≥0, y≥0, z≥0, and wherein at least x, y, or z comprise values >0) such as: ammonia ($NH_3$), cyano ($CN^-$), azide ion ($N_3^-$) ethylene diamine ($C_2H_8N_2$), phen(1,10-phenanthroline) ($C_{12}H_8N_2$), 2,2'bipyridine ($C_{10}H_8N_2$), ethylenediamine (($C_2H_4(NH_2)_2$), pyridine ($C_5H_5N$), acetonitrile ($CH_3CN$), and cyanosulfanides such as thiocyanate ($NCS^-$), for example. NiO variable impedance materials disclosed herein may include members of an oxynitride family ($N_xO_y$, wherein x and y comprise whole numbers, and wherein x≥0 and y≥0 and at least x or y comprise values >0), which may include, for example, nitric oxide (NO), nitrous oxide ($N_2O$), nitrogen dioxide ($NO_2$), or precursors with an $NO_3^-$ ligand. In embodiments, metal precursors comprising nitrogen-containing ligands, such as ligands amines, amides, alkylamides nitrogen-containing ligands with NiO by balancing valences.

In embodiments, depending on a molecular concentration of NiO:CO or NiO:$NH_3$, for example, which may vary from values approximately in the range of an atomic concentration of 0.1% to 10.0%, $V_{RESET}$ and $V_{SET}$, as shown in FIG. 1A, may vary approximately in the range of 0.1 V to 10.0 V subject to the condition that $V_{SET} \geq V_{RESET}$. For example, in one possible embodiment, $V_{RESET}$ may occur at a voltage from about 0.1 V to about 1.0 V, and $V_{RESET}$ may occur at a voltage of about 1.0 V to about 2.0 V, for example. It should be noted, however, that variations in $V_{SET}$ and $V_{RESET}$ may occur based, at least in part, on a variety of factors, such as atomic concentration of materials such as NiO:CO or NiO:$NH_3$ and other materials present in the CEM device, as well as other process variations, and claimed subject matter is not limited in this respect.

Also in this context, an "electrode" as used herein means a conductive structure comprising a surface that enables materials, such as materials operating to provide an electrical function, to be deposited or placed on or over the electrode. For example, in a CEM-based device, a metallic electrode may comprise a significant atomic concentration of metal, may operate to conduct an electrical current to the CEM-based device in contact with the conductive metallic electrode. In embodiments, a metallic electrode may be constructed via a deposition process and may comprise a titanium or titanium-based material, such as titanium nitride (TiN). In embodiments, a metallic electrode may comprise one or more d-block or f-block elements other than titanium, such as platinum, copper, aluminum, cobalt, nickel, tungsten, tungsten nitride, cobalt silicide, ruthenium, ruthenium oxide, chromium, gold, palladium, indium tin oxide, tantalum, silver, iridium or iridium oxide, or any combination thereof, and claimed subject matter is not limited to any particular composition of conductive substrate material. It should be noted, however, that claimed subject matter is intended to embrace metallic electrodes of the form ML:$L_{dopant}$, in which "M" indicates a metal ion, such as a d-block or f-block element, "L" indicates a dominant ligand, such as oxygen in an NiO molecule, and in which $L_{dopant}$ comprises a dopant ligand, such as carbonyl (CO) in an NiO:CO complex and $NH_3$ in NiO:$NH_3$ complex, just to name two possible examples.

Also in this context, a "layer" as the term is used herein, means a material composition which, in aggregation with one or more additional layers on and/or beneath a particular layer, form a larger structure, such as a structure comprising one or more CEM devices. Thus, for example, a wafer comprising one or more CEM devices may be formed by accumulating or aggregating two or more layers deposited utilizing a suitable deposition process. In embodiments, structures comprising one or more CEM devices may comprise any number of layers, such as two layers, five layers, 10 layers, 50 layers, or a number of layers that may number into the thousands and beyond. In certain embodiments, a layered structure, such as a wafer, for example, may comprise substrate layers, CEM layers, layers comprising one or more conductive traces to traverse an area of the layered structure, layers comprising insulative material, as well as layers forming transistors, diodes, switches, passive circuit elements (e.g., capacitors, inductors, and so forth), interconnections between or among circuits, and a wide variety of layers to perform additional electrical functions, and claimed subject matter is not limited in this respect.

Further, in this context, a substrate may correspond to a first layer, or a first group of layers, of a wafer. Thus, for example, a transistor, logic device, diode, sensor, for example, may operate on or over a substrate or first layer of a wafer. At a second layer of a wafer, or at a second group of layers of a wafer, one or more conductive traces to route signals may disposed, as well as one or more interconnects, such as optical interconnects, for example, may be positioned. Particular devices, such as CEM devices, operating on or over first layer of a wafer (or first group of layers of a wafer) may be physically separated and/or electrically isolated by a second layer of a wafer (or second group of layers of a wafer) by an insulating material, such as silicon nitride. Accordingly, in this context, a "wafer," as the term is used herein, means a multi-layered collection of devices, such as CEM devices, which may perform a number of logic, switching, access, RF, signal reception and/or signal transmission, or other electrical and/or logic functions, utilizing a plurality of layers forming a structure comprising a fabricated wafer.

In particular embodiments, a deposition process may utilize two or more precursors to deposit components of, for example, NiO:CO or NiO:$NH_3$, for example, onto a conductive metallic electrode positioned over a substrate. In an embodiment, a CEM film may be deposited, for example, utilizing separate precursor molecules, AX and BY, substantially in accordance with expression (4a), below:

$$AX_{(gas)} + BY_{(gas)} = AB_{(solid)} + XY_{(gas)} \quad (4a)$$

Wherein "A" of expression (4a) corresponds to a transition metal, transition metal compound, transition metal oxide, or any combination thereof. In embodiments, a transition metal oxide may comprise nickel, but may comprise other transition metals, transition metal compounds, and/or transition metal oxides, such as aluminum, cadmium, chromium, cobalt, copper, gold, iron, manganese, mercury, molybdenum, nickel, palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate ($YTiO_3$).

In embodiments, "X" of expression (4a) may comprise a ligand, such as an organic ligand, comprising amidinate (AMD), dicyclopentadienyl $(Cp)_2$, diethylcyclopentadienyl $(EtCp)_2$, Bis(2,2,6,6-tetramethylheptane-3,5-dionato) $((thd)_2)$, acetylacetonate (acac), bis(methylcyclopentadienyl) $((CH_3C_5H_4)_2)$, dimethylglyoximate $(dmg)_2$, 2-aminopent-2-en-4-onato $(apo)_2$, $(dmamb)_2$ where dmamb=1-dimethylamino-2-methyl-2-butanolate, (dmamp)2 where dmamp=1-dimethylamino-2-methyl-2-propanolate, Bis (pentamethylcyclopentadienyl) $(C_5(CH_3)_5)_2$ and carbonyl $(CO)_4$. Accordingly, in some embodiments, nickel-based precursor AX may comprise, for example, nickel amidinate (Ni(AMD)), nickel dicyclopentadienyl $(Ni(Cp)_2)$, nickel diethyl cyclopentadienyl $(Ni(EtCp)_2)$, Bis(2,2,6,6-tetramethylheptane-3,5-dionato)Ni(II) $(Ni(thd)_2)$, nickel acetylacetonate $(Ni(acac)_2)$, bis(methylcyclopentadienyl)nickel (Ni $(CH_3C_5H_4)_2$, Nickel dimethylglyoximate $(Ni(dmg)_2)$, Nickel 2-amino-pent-2-en-4-onato $(Ni(apo)_2)$, $Ni(dmamb)_2$ where dmamb=1-dimethylamino-2-methyl-2-butanolate, $Ni(dmamp)_2$ where dmamp=1-dimethylamino-2-methyl-2-propanolate, Bis(pentamethylcyclopentadienyl) nickel (Ni $(C_5(CH_3)_5)_2$, and nickel carbonyl $(Ni(CO)_4)$, just to name a few examples. In expression (4a), precursor "BY" may comprise an oxidizer, such as oxygen $(O_2)$, ozone $(O_3)$, nitric oxide (NO), hydrogen peroxide $(H_2O_2)$, just to name a few examples. In other embodiments as will be described further herein, plasma may be used with an oxidizer to form oxygen radicals.

However, in particular embodiments, a dopant in addition to precursors AX and BY may be utilized to form films utilized in a CEM device. An additional dopant ligand may co-flow with precursor AX to permit formation of compounds, substantially in accordance with expression (4b), below. In embodiments, a dopant comprising, for example, as ammonia ($NH_3$), methane ($CH_4$), carbon monoxide (CO), or other material may be utilized, as may other ligands comprising carbon or nitrogen or other dopants listed above. Thus, expression (4a) may be modified to include an additional dopant ligand substantially in accordance with expression (4b), below:

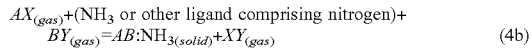

$$AX_{(gas)} + (NH_3 \text{ or other ligand comprising nitrogen}) + BY_{(gas)} = AB:NH_{3(solid)} + XY_{(gas)} \quad (4b)$$

It should be noted that concentrations, such as atomic concentration, of precursors, such as AX, BY, and $NH_3$ (or other ligand comprising nitrogen) of expressions (4a) and (4b) may be adjusted so as to bring about a final atomic concentration of nitrogen or carbon dopant, for example, such as in the form of ammonia ($NH_3$) or carbonyl (CO) comprising an atomic concentration of between approximately 0.1% and 15.0%. However, claimed subject matter is not necessarily limited to the above-identified precursors and/or atomic concentrations. Rather, claimed subject matter is intended to embrace all precursors utilized used in CEM film deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices. In expressions (4a) and (4b), "BY" may comprise an oxidizer, such as oxygen ($O_2$), ozone ($O_3$), nitric oxide (NO), hydrogen peroxide ($H_2O_2$), just to name a few examples. In other embodiments, plasma may be used with an oxidizer (BY) to form oxygen radicals. Likewise, plasma may be used with the doping species comprising material to form an activated species to control the doping concentration of a CEM.

In particular embodiments, such as embodiments utilizing deposition techniques, a metallic electrode may be exposed to precursors, such as AX and BY, as well as dopants comprising other materials (such as ammonia or other ligands comprising metal-nitrogen bonds, including, for example, nickel-amides, nickel-imides, nickel-amidinates, or combinations thereof) in a heated chamber, which may attain, for example, a temperature approximately in the range of 20.0° C. to 1000.0° C., for example, or between temperatures approximately in the range of 20.0° C. and 500.0° C. in certain embodiments. In one particular embodiment, in which a deposition technique utilizes $NiO:NH_3$, for example, is performed, chamber temperature ranges approximately in the range of 20.0° C. and 400.0° C. may be utilized. Responsive to exposure to precursor gases (e.g., AX, BY, $NH_3$, or other ligand comprising nitrogen), such gases may be purged from the heated chamber for durations approximately in the range of 0.5 seconds to 180.0 seconds. It should be noted, however, that these are merely examples of potentially suitable ranges of chamber temperature and/or time and claimed subject matter is not limited in this respect.

In certain embodiments, a single two-precursor cycle (e.g., AX and BY, as described with reference to expression 4(a)) or a single three-precursor cycle (e.g., AX, $NH_3$, $CH_4$, or other ligand comprising nitrogen, carbon or other dopant material, and BY, as described with reference to expression 4(b)) utilizing deposition technique may bring about a CEM device film comprising a thickness approximately in the range of 0.6 Å to 5.0 Å per cycle). Accordingly, in an embodiment, to form a CEM device film comprising a thickness of approximately 500.0 Å utilizing a deposition process in which CEM films comprise a thickness of approximately 0.6 Å, 800-900 cycles, for example, may be utilized. In another embodiment, utilizing a film deposition process in which films comprise approximately 5.0 Å, 100 two-precursor cycles, for example. It should be noted that deposition processes may be utilized to form CEM device films having other thicknesses, such as thicknesses approximately in the range of 1.5 nm and 150.0 nm, for example, and claimed subject matter is not limited in this respect.

In particular embodiments, responsive to one or more two-precursor cycles (e.g., AX and BY), or three-precursor cycles (AX, $NH_3$, $CH_4$, or other ligand comprising nitrogen, carbon or other dopant and BY), of a deposition technique, a CEM device film may undergo in situ annealing, which may permit improvement of film properties or may be used to incorporate a dopant, such as in the form of carbonyl or ammonia, in the CEM device film. In certain embodiments, a chamber may be heated to a temperature approximately in the range of 20.0° C. to 1000.0° C. However, in other embodiments, in situ annealing may be performed utilizing chamber temperatures approximately in the range of 100.0° C. to 800.0° C. In situ annealing times may vary from a duration approximately in the range of 1.0 seconds to 5.0 hours. In particular embodiments, annealing times may vary within more narrow ranges, such as, for example, from approximately 0.5 minutes to approximately 180.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately after fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, $V_{RESET}$ may occur at a voltage equal to about 0.1 V to about 1.0 V, and $V_{SET}$ may occur at a voltage equal to about 1.0 V to about 2.0 V, for example. Accordingly, electrical switching voltages operating in a range of approximately 2.0 V, or less, may permit operations of the CEM device. In embodiments, such relatively low voltage operation may reduce complexity, cost, and may provide other advantages over competing memory and/or switching device technologies.

Figure 1B:
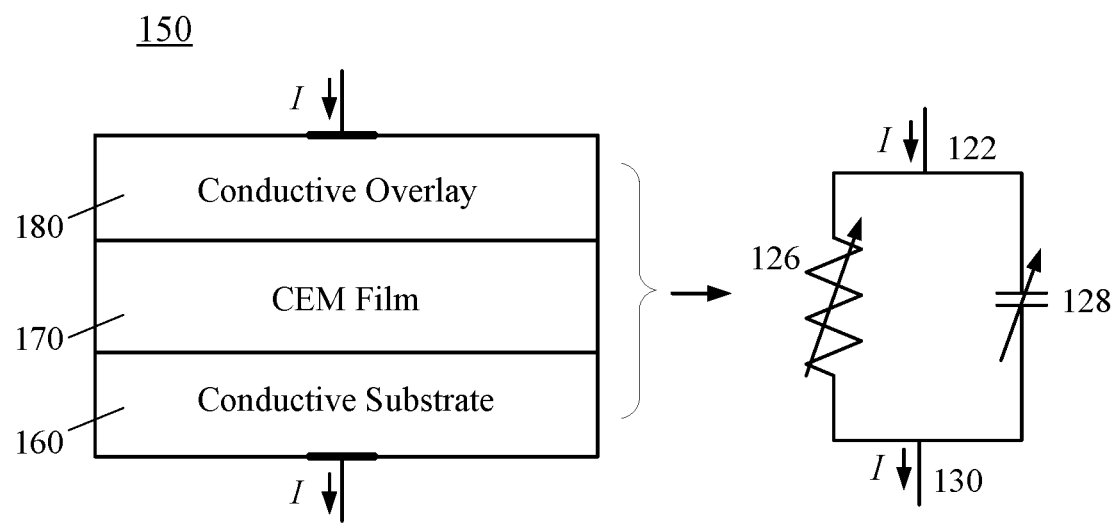
FIG. 1B is an illustration of an embodiment of a CEM device and a schematic diagram of an equivalent circuit of the CEM device.

FIG. 1B is an illustration of an embodiment 150 of a CEM device and a schematic diagram of an equivalent circuit of the CEM device. As previously mentioned, a correlated electron device, such as a correlated electron switch, a CEM-based diode, or other type of device utilizing one or more correlated electron materials may comprise a variable or complex impedance device that may comprise characteristics of both variable resistance and variable capacitance. In other words, impedance characteristics for a CEM variable impedance device, such as a device comprising a metallic electrode 160, CEM 170, and conductive overlay 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as device of embodiment 150, may comprise a substantially homogenous CEM and claimed subject matter is not limited in this respect.

Table 1, below, depicts an example truth table for an example variable impedance device, such as the device of embodiment 150.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

In an embodiment, Table 1 shows that a resistance of a variable impedance device, such as the device of embodiment 150, may transition between a low-impedance state and a substantially dissimilar, high-impedance state as a function at least partially dependent on a voltage applied across a CEM device. In an embodiment, an impedance exhibited at a low-impedance state may be approximately in the range of 10.0 to 100,000.0 times lower than an impedance exhibited in a high-impedance state. In other embodiments, an impedance exhibited at a low-impedance state may be approximately in the range of 5.0 to 10.0 times lower than an impedance exhibited in a high-impedance state, for example. It should be noted, however, that claimed subject matter is not limited to any particular impedance ratios between high-impedance states and low-impedance states. Table 1 shows that a capacitance of a variable impedance device, such as the device of embodiment 150, may transition between a lower capacitance state, which, in an example embodiment, may comprise approximately zero (or very little) capacitance, and a higher capacitance state that is a function, at least in part, of a voltage applied across a correlated electron switch.

Figure 2:
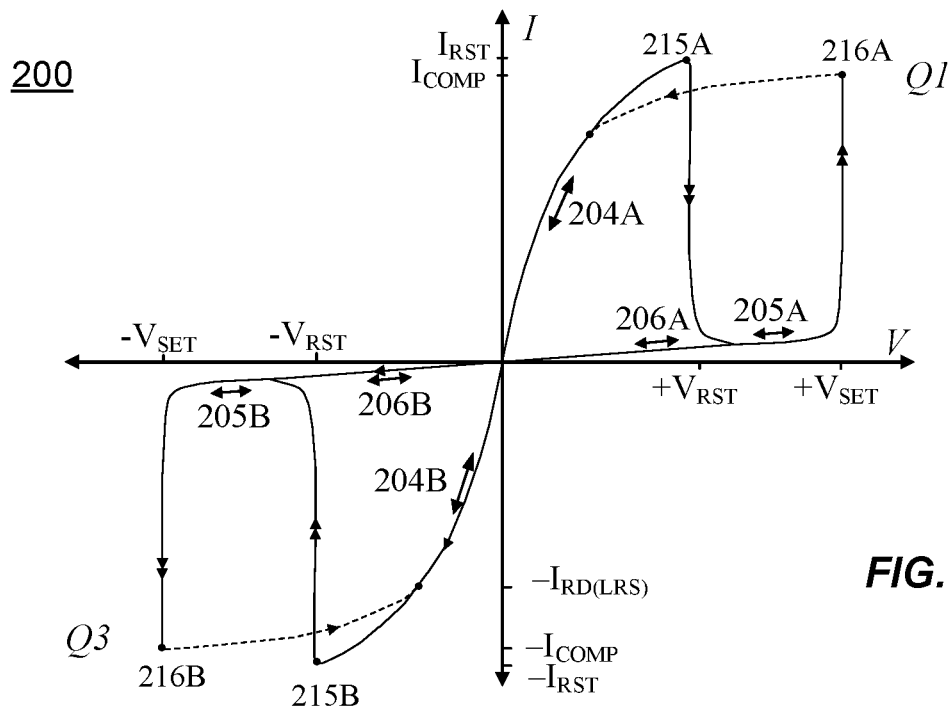
FIG. 2 is a graphical representation showing additional details of a voltage versus current profile of a device formed from a CEM according to an embodiment.

FIG. 2 is a graphical representation of an impedance profile of a device formed from a correlated electron material according to an embodiment 200. In embodiment 200, the impedance profile relates the response of a CEM device to a voltage applied across first and second terminals of the CEM device. In particular embodiments, a CEM device comprises a "born on" property in which the device may exhibit relatively low impedance (relatively high conductivity) immediately after fabrication of the device such as shown in region 204A of FIG. 2. In certain embodiments, a born-on property of a CEM device may operate in a first quadrant (Q1), in which a current may flow in a first direction responsive to a positive voltage applied across a CEM device. A CEM device may operate in a manner that is symmetrical with respect to current through the CEM device in response to a voltage applied across the device, such as described with respect to embodiment 200 of FIG. 2.

In this context, "symmetrical" operation of the CEM device may be defined as a device that permits bidirectional current flow, which refers to current flow in a first direction responsive to application of a voltage comprising a first sense (such as positive) and permits current flow in a second direction, which is a polar opposite the first direction, responsive to application of voltage comprising a second sense (such as negative). Additionally, current flow in the second direction may be of substantially the same magnitude as current flow in the first direction under a voltage of substantially the same magnitude. Further, in the context of "symmetrical" operation of a CEM device, such as a CEM diode, for example, "symmetrical" does not necessarily indicate mirror-like operation of a CEM device with respect to current through device in response to a voltage applied across terminals of the device. Accordingly, variations (e.g., ±2.5%, ±5.0%, ±10.0%) in magnitudes of $V_{SET}$ values as well as $V_{RESET}$ may be embraced by the definition of symmetrical operation of a CEM device. In addition, variations in magnitudes of $I_{RST}$ and $I_{COMP}$ may be embraced by the definition of symmetrical operation of a CEM device. Further in this context, "partial symmetry" of a CEM device means symmetrical operation over at least the portion of the impedance profile of the CEM device that spans $-V_{SET}$ to $+V_{SET}$.

In the embodiment of FIG. 2, as a voltage applied across terminals of a CEM device is increased from a value of, for example, 0.0 volts (V), a current flow may occur in response. As an applied voltage is increased, such as to $V_{RST}$, current flow through a CEM device may increase to a level $I_{RST}$ before beginning a steep decline, such as at point 215A. In embodiments, current flow may decline to a smaller value, which may approach 20.0% of $I_{RST}$, 10.0% of $I_{RST}$, 1.0%, 0.1% of $I_{RST}$, or an even smaller fraction of $I_{RST}$, for example. As previously mentioned herein, a steep decline, such as from a current of $I_{RST}$ to a fraction of $I_{RST}$, may be indicative of region of operation that indicates a Mott transition. As a voltage applied across a CEM device is increased beyond $V_{RST}$, the device may begin operating in a relatively high-impedance state, such as shown in region 205A of FIG. 2. It should be noted that in particular embodiments, responsive to application of a decreasing voltage, such as a voltage less than $V_{RST}$, a CEM device may operate in region 206A of FIG. 2.

Returning to operation of a CEM device in region 205A (a relatively high-impedance state), applying an increasing voltage across first and second terminals of the CEM device may give rise to a relatively steep increase in current flow, at $V_{SET}$, until current flow through the CEM device reaches a compliance current, indicated as $I_{COMP}$ in FIG. 2. Accordingly, at point 216A, which may represent a region of operation that indicates a Mott-like transition. At point 216A, the CEM device may transition (e.g., turn-on) to a low-impedance state, such as shown as region 204A of FIG. 2. In embodiments, decreasing a voltage applied across first and second terminals of a CEM device, such as to voltages approaching values of 0.0 V, as well as voltages comprising negative values, may give rise to operation of the CEM device in region 204A of FIG. 2. As a voltage applied across terminals of a CEM device is further decreased (e.g., to comprise larger negative values), such as to voltage $-V_{RST}$, may give rise to a current flow such as $-I_{RST}$, for example. As an applied voltage is further decreased (e.g., to comprise larger negative values) to a level less than $-V_{RST}$, current flow through CEM device may change from a level $-I_{RST}$, such as at point 215B, to a smaller negative value, which may approach 20.0% of $-I_{RST}$, 10.0% of $-I_{RST}$, 1.0% of $-I_{RST}$, 0.1% of $-I_{RST}$, or to an even smaller fraction of $-I_{RST}$, for example. As previously mentioned herein, an abrupt, steep transition, such as from a current of $-I_{RST}$ to a fraction of $-I_{RST}$ may represent a Mott transition within a CEM device. As a voltage applied across terminals of a CEM device is further decreased to values less than $-V_{RST}$, the CEM device may operate in a relatively high-impedance state, such as in region 205B of FIG. 2. It should be noted that in particular embodiments, responsive to application of an increasing voltage (e.g., a voltage approaching 0.0), such as a voltage greater than $-V_{RST}$, a CEM device may operate in region 206B of FIG. 2.

Returning to operation of a CEM device in region 205B, applying an decreasing voltage (e.g., to comprise larger negative values) across first and second terminals of the CEM device may give rise to a relatively large negative current flow, such as at $-V_{SET}$ until current flow through the CEM device reaches a compliance current, indicated as $-I_{COMP}$ in FIG. 2. Accordingly, at point 216B a Mott-like transition may occur, in which the CEM device may transition to a low-impedance state, such as shown in region 204B of FIG. 2. In embodiments, increasing a voltage across terminals of a CEM device, such as to voltage levels of 0.0 V, may give rise to operation of the CEM device in region 204B of FIG. 2.

Figure 3:
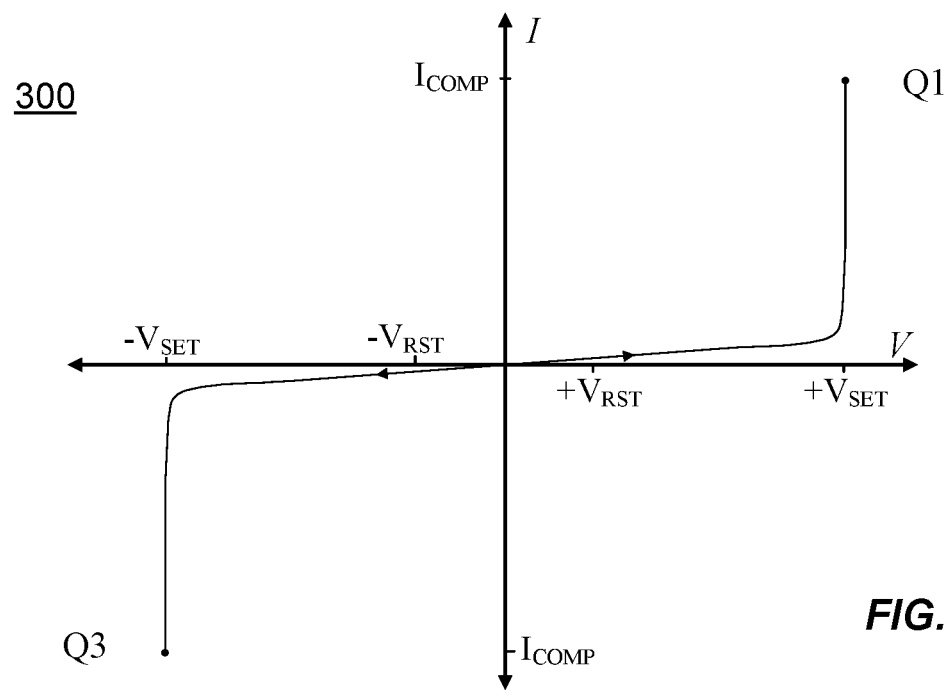
FIG. 3 is a graphical representation of an impedance profile of a CEM device operating as a diode and comprising at least partially symmetric operation with respect to impedance of the CEM device, according to an embodiment.

FIG. 3 is a graphical representation of an impedance profile of a CEM device operating as a diode and comprising at least partially symmetric operation with respect to impedance of the CEM device. Embodiment 300, for example, may be brought about by limiting electrical current permitted to flow through a CEM device. In embodiments, responsive to current limiting by, for example, a circuit element, such as a resistive memory element, and/or an external resistive circuit element, may operate to limit and/or to constrain a quantity of electrons that may be available to flow through the CEM device. Accordingly, a Mott transition, such as may occur responsive to a concentration of electrons n approaching a concentration of electron holes p (substantially in accordance with expression (1)) may be inhibited. Thus, a CEM device may operate in a region of an impedance profile that is absent a Mott or Mott-like transition.

As shown in FIG. 3, a CEM device may comprise symmetrical operation with respect to impedance of the device. Thus, responsive to application of a positive voltage across first and second terminals of the device, such as $V_{RST}$ or $V_{SET}$, a positive current may flow. Additionally, responsive to application of a negative voltage across first and second terminals of the device, such as $-V_{SET}$ or $-V_{RST}$, a negative current may flow. Further, in particular embodiments, the impedance profile of a CEM device, may be adapted to operate in an absence of a Mott or Mott-like transition. Thus, for example, a region of an impedance profile that indicates an absence of a Mott or Mott-like transition indicated by points 216A, 216B, 215A, and 215B, of the current versus voltage profile of FIG. 2. A CEM device may additionally comprise a monotonically increasing impedance profile over a particular operating voltage domain, which, in this context, means that for increasing voltages applied across first and second terminals, an increased voltage applied across the CEM device gives rise to an increased current flowing through the CEM device. For example, referring to FIG. 3, as an applied voltage is increased from $-V_{SET}$, to $-V_{RST}$, to $V_{RST}$, and to $V_{SET}$ current flowing through the CEM device likewise increases.

Figure 4:
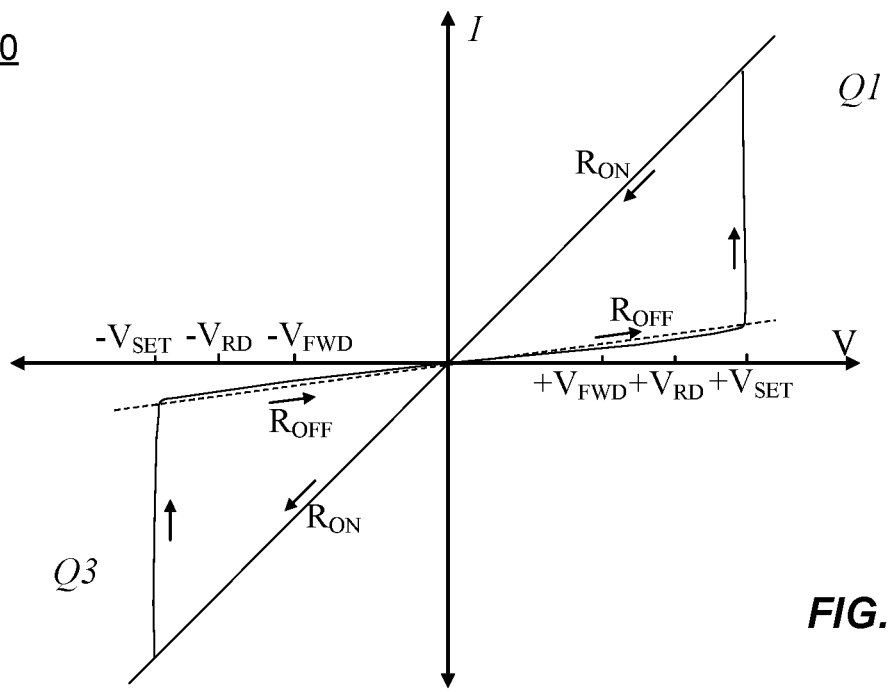
FIG. 4 is a graphical representation of a voltage versus current profile of a resistive memory element according to an embodiment.

FIG. 4 is a graphical representation of a voltage versus current profile of a resistive memory element according to an embodiment 400. In particular embodiments, a resistive memory element may operate in a manner that is distinct from operation of CEM devices. For example, a resistive memory element (which may be referred to as a RERAM memory element) may comprise, for example, a metallic oxide or oxide filament in which, in a first operating state, a particular voltage signal applied between first and second terminals of the resistive memory element may operate to permit charges to flow within the memory element. In a second operating state, an absence of a metallic oxide or oxide filament of the RERAM memory element may inhibit movement of charges between terminals of the memory element. In another embodiment, a resistive memory element, such as a phase change random access memory (PCRAM) element, may operate in a first material phase, such as an amorphous material phase, to give rise to relatively limited current flow between terminals of the memory element in response to an applied voltage. In a second material phase of a PCRAM element, such as a crystalline material phase, a relatively larger current may flow between terminals of a resistive memory element.

In another embodiment of a resistive memory element, such as a conductive bridging random access memory (which may be referred to as a CBRAM) a first resistive state of a memory element may occur in response to formation of metallic filaments. A second resistive state of a CBRAM may occur in response to an absence of formation of the metallic filaments. In another embodiment of a resistive memory element, such as a nanotube random access memory (which may be referred to as a Nanotube RAM or NRAM), movement of carbon nanotubes to form a conductive path may bring about a first resistive state, which may comprise a relatively conductive state, of a memory element. A second resistive state of a Nano-RAM or NRAM may be brought about by movement of carbon nanotubes, so as to restrict formation of a conductive path, may bring about a second resistive state, such as a relatively insulative state, of the memory element. In another embodiment, a resistive memory element may correspond to spin-transfer torque magnetic random access memory (STT-MRAM) that utilizes a tunneling magnetoresistive effect for reading from a memory element and a spin-transfer torque (STT) effect for writing to a memory element. It should be noted that claimed subject matter is intended to embrace all types of resistive memory elements, which may operate in a manner that is distinct from operation of CEM devices, wherein a logic state may be encoded as a resistance level, or a range of resistance levels, which may be sensed across terminals of the memory element.

As shown in FIG. 4, a resistive memory element may comprise distinct resistances, such as $R_{OFF}$ and $R_{ON}$, for example, which may correspond to high-resistivity ($R_{OFF}$) and low-resistivity ($R_{ON}$) states of a resistive random access memory (RERAM or RRAM). In embodiments, a resistive memory element comprising a voltage versus current profile in accordance with that of FIG. 4 may correspond to a variety of resistive memory elements.

In the embodiment of FIG. 4, at quadrant 1 (Q1), for a resistive memory element in a high-resistance state (e.g., $R_{OFF}$), a comparatively small current may flow responsive to application of a small positive voltage such as $V_{FWD}$, applied across first and second terminals of the memory element. As a voltage applied across terminals of the resistive memory element increases, such as to $V_{RD}$, which corresponds to a read voltage at which the high/low resistance state of the resistive memory element may be determined, a larger electrical current may be permitted to flow through the device. As a voltage applied across the resistive memory element continues to increase, such as to $V_{SET}$, the memory element may transition from a high-resistance state to a low-resistance state (e.g., $R_{OFF}$). Accordingly, responsive to a transition to a low-resistance state, an increased current may be permitted to flow through the resistive memory element. As an applied voltage is decreased, a decreasing current may flow through the resistive memory element. In embodiments, decreasing a voltage applied across terminals of a resistive memory element, such as to voltages comprising values of 0.0 V as well as to negative voltages, such as $-V_{FWD}$ at quadrant 3 (Q3), a current may flow in an opposite direction. As a voltage applied across terminals of the device is decreased (e.g., to comprise larger negative values), such as to $-V_{RD}$ and to $-V_{SET}$, a resistive memory element may transition from a low-resistance ($R_{ON}$) state to a high-resistance state ($R_{OFF}$). As a voltage applied across terminals of the resistive memory element, current flowing through the memory element may correspondingly decrease.

Thus, the resistive memory element of FIG. 4 comprises bipolar operation. In this context, "bipolar" operation of a resistive memory element means application of voltages of a first polarity and a second polarity, such as a positive polarity and a negative polarity, for example, to bring about differing resistive states of a material. For example, in the embodiment of FIG. 4, to bring about a transition of a resistive memory element from a high-resistance state ($R_{OFF}$) to a low-resistance state ($R_{ON}$), a positive voltage, such as $V_{SET}$ may be applied. Further, to transition the resistive memory element from a low-resistance state to a high-resistance state (e.g., $R_{ON}$ to $R_{OFF}$) a negative voltage, such as $-V_{SET}$ may be applied.

Figure 5:
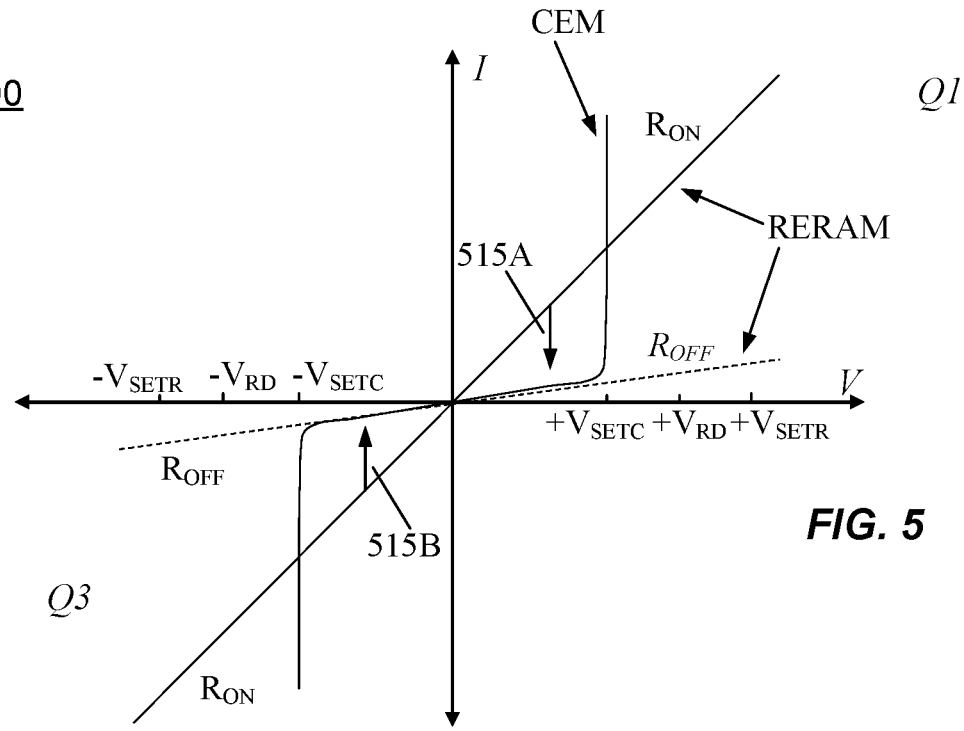
FIG. 5 is a graphical representation of an impedance profile of a compound device comprising a CEM device operating as a diode, coupled in series with a resistive memory element according to an embodiment.

FIG. 5 is a graphical representation of an impedance profile of a compound device comprising a CEM device operating as a diode in series with a resistive memory element according to an embodiment 500. Elements of the voltage versus current profile of the CEM device operating as a diode of FIG. 3 and elements of the voltage versus current profile of the resistive memory element of FIG. 4 are represented on the impedance profile of FIG. 5. It should be noted, however, that the voltage $V_{SET}$ depicted in FIG. 3, has been renamed to $V_{SETC}$ in FIG. 5 so as to correspond to the voltage at which a "set" operation occurs within a CEM device. It should additionally be noted that the voltage $V_{SET}$ of FIG. 4 has been renamed to $V_{SETR}$ in FIG. 5 so as to correspond to the voltage at which a "set" operation occurs within a resistive memory element. Further, in FIG. 5, $V_{RD}$ corresponds to a read voltage at which the high/low resistance state of the resistive memory element may be determined. Thus, in an embodiment, $\pm V_{SETC}$, $\pm V_{RD}$, and $\pm V_{SETR}$ may comprise the following voltage ranges:

$V_{SETC} \approx 1.3$ to $1.8$ V, $-V_{SETC} \approx -1.3$ to $-1.8$ V $V_{RD} \approx +1.5$ V, $-V_{RD} = -1.5$ V $V_{SETR} \approx 2.5$ to $3.0$ V, $-V_{SETR} \approx -2.5$ to $-3.0$ V Thus, as shown in FIG. 5, a compound device that includes a CEM device operating as a diode in series with a resistive memory element may comprise a high-impedance state for applied voltages between $-V_{SETC}$ and $V_{SETC}$ (e.g., $-1.2$ V to $1.2$ V). In particular embodiments, such high-impedance operation may be advantageous when a resistive memory element operates in a low-impedance state (e.g., $R_{ON}$). Under such conditions, $R_{ON}$ current, which may be characterized as leakage current flowing when relatively small voltages are applied across the terminals of the resistive memory cell, may be limited by the high-impedance operation of the CEM device in series with the resistive memory element. In FIG. 5, arrows 515A and 515B indicate a reduction in leakage current between $-V_{SETC}$ and $V_{SETC}$. At voltages between $+V_{RD}$ and $+V_{SETR}$, as well as between $-V_{SETR}$ and $-V_{RD}$, which corresponds to voltages at which an increased current may flow through the CEM device, the resistance behavior of the compound predominantly responsive to internal resistances of the resistive memory cell.

Figure 6A:
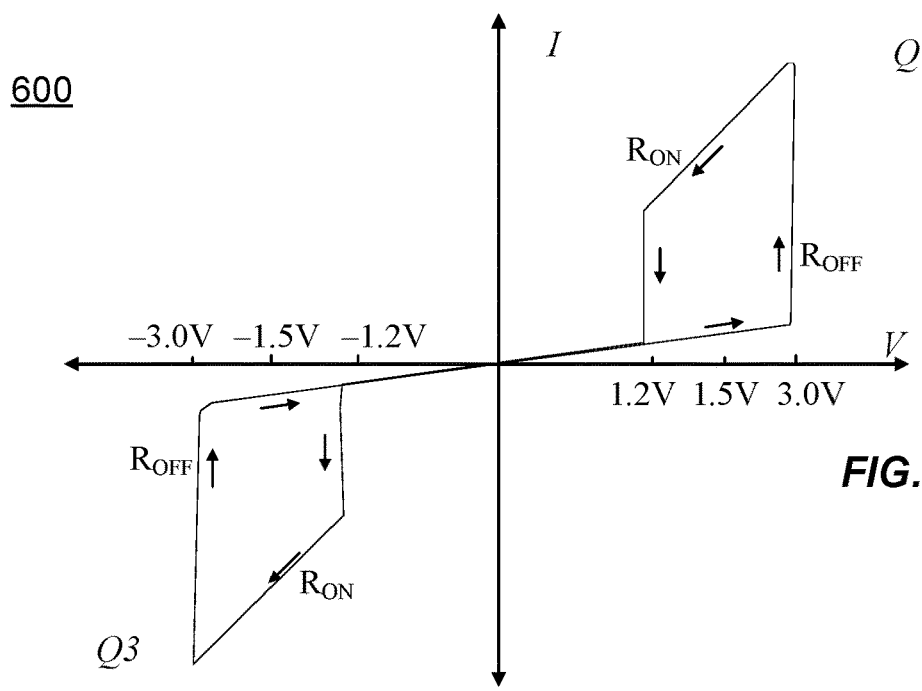
FIG. 6A is a graphical representation of an operating envelope, with respect to voltage versus current, of a compound device according to an embodiment.
Figure 6B:
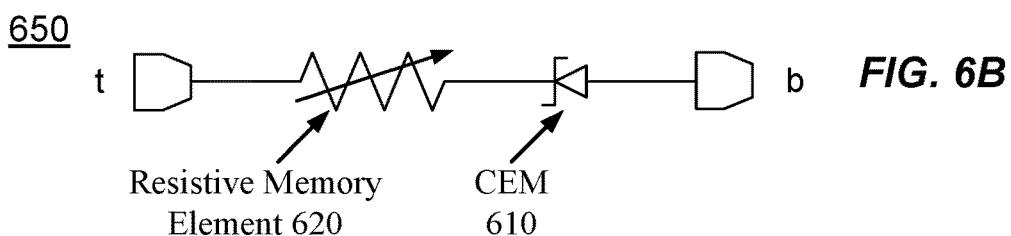
FIG. 6B is a schematic of a compound device comprising a CEM device coupled in series with a resistive memory element.

FIG. 6A is a graphical representation of an operating envelope, with respect to impedance, of a compound device, such as the compound device of FIG. 6B, according to an embodiment 600. In the embodiment of FIG. 6B, a compound device comprises CEM device 610 coupled in series with resistive memory element 620, which may be characterized by the impedance profile of FIG. 6A, for example. As shown in FIG. 6A and as described previously with reference to FIG. 5, a compound device may comprise significantly reduced leakage current at applied voltages between $-1.2$V and $1.2$V. In particular embodiments, voltages of about $-1.2$ V and $1.2$ V correspond to turn-on voltages for CEM device 610, which, in this context, refers to a voltage at which strong conduction of an electrical current may occur. However, as previously mentioned, in view of resistance introduced by a resistive memory element in series with CEM device 610, an electrical current may remain below a threshold at which a Mott transition may occur (e.g. transition from high-impedance to low-impedance). In other embodiments, CEM device 610 may be designed, such as via selective doping, for example, so as to that inhibit a Mott transition.

Thus, in the embodiment of FIG. 6A, at quadrant 1 (Q1), for a compound device operating in a high-resistance state (e.g., $R_{OFF}$), a relatively small current may flow responsive to application of a small positive voltage such as voltages less than, for example, 1.2 V. As a voltage applied across the compound device increases, such as to 1.5 V, which may correspond to a voltage at which the high/low resistance state of the resistive memory element of the compound device may be determined (read voltage), a larger electrical current may be permitted to flow. As a voltage applied across the compound device continues to increase, such as to 3.0 V, for example, the memory element may transition from a high-resistance state (e.g., $R_{OFF}$) to a low-resistance state (e.g., $R_{ON}$). Accordingly, a relatively large current may be permitted to flow through the resistive memory element. As an applied voltage is decreased, a correspondingly decreased current may flow through the compound device. In embodiments, decreasing a voltage applied across terminals of a resistive memory element, such as to voltages of 0.0 V as well as to negative voltages, such as −1.2 V at quadrant 3 (Q3), a current may flow in an opposite direction. As a voltage across a compound device is further decreased, such as to −2.5 V to −3.0 V, a compound device may transition from a low-impedance ($R_{ON}$) state to a high-impedance state ($R_{OFF}$). As a voltage applied to terminals of a resistive memory element is increased, so as to return to 0.0 V, current flowing through the compound device may decrease correspondingly.

Figure 7A:
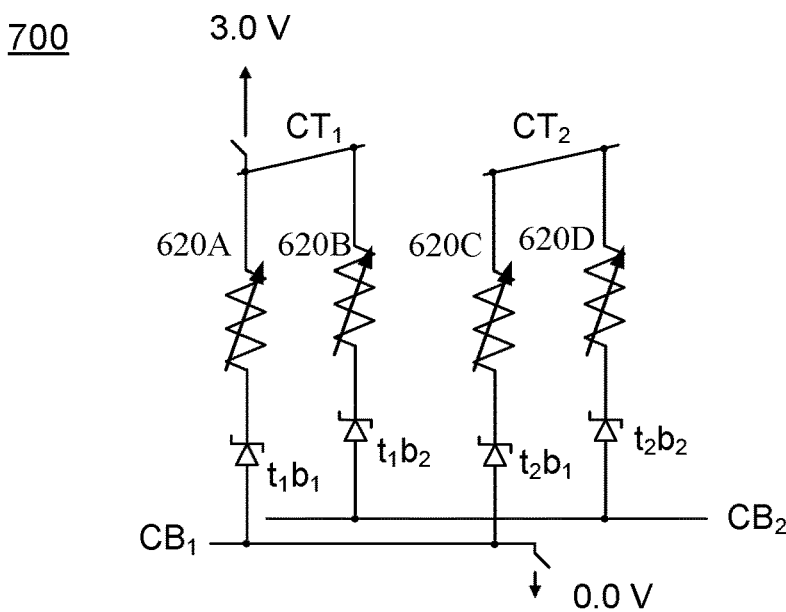
FIG. 7A is a schematic diagram showing an arrangement of compound devices, such as those illustrated in FIG. 6B according to an embodiment.

FIG. 7A is a schematic diagram showing an arrangement of compound devices, such as those illustrated in FIG. 6B, according to an embodiment 700. It should be noted that a wide variety of additional arrangements of compound devices are possible, and claimed subject matter is not limited to any particular arrangement of compound devices. In FIG. 7A, compound devices are arranged in a cross point array, in which common top electrode $CT_1$ is common among CEM device $t_1b_1$ and CEM device $t_1b_2$, and common top electrode $CT_2$ is common among CEM device $t_2b_1$ and CEM device $t_2b_2$. Resistive memory elements 620A, 620B, 620C, and 620D are arranged in series with CEM devices $t_1b_1$, $t_1b_2$, $t_2b_1$, and $t_2b_2$ (respectively). In FIG. 7A, and bottom electrode $CB_1$ is common among CEM device $t_1b_1$ and CEM device $t_2b_1$, and, and bottom electrode $CB_2$ is common among CEM device $t_1b_2$ and CEM device $t_2b_2$. Thus, common top electrodes $CT_1$ and $CT_2$ may operate in combination with common bottom electrodes CB1 and CB2 to read from and to write to memory elements of CEM devices $t_1b_1$, $t_1b_2$, $t_2b_1$, and $t_2b_2$. The cross point memory arrangement of FIG. 7A may permit a circuit, for example, to select an individual CEM device while deselecting the remaining CEM devices. However, common top electrodes $CT_1$ and $CT_2$ and common bottom electrodes $b_1$ and $b_2$ may perform different functions, and claimed subject matter is not limited in this respect.

Thus, in one example, a 3.0 V signal applied to common top electrode $CT_1$ and a 0.0 V signal applied to common bottom electrode $CB_1$ may bring about a voltage across CEM device $t_1b_1$ sufficient to place the CEM device into a low-impedance state. Accordingly, resistive memory element 620A may undergo a "set" operation to place the resistive memory element into a $R_{on}$ state. However, CEM device $t_1b_2$, CEM device $t_2b_1$, and CEM device $t_2b_2$ may remain deselected, thus preserving the $R_{on}/R_{off}$ states of memory elements 620B, 620C, and 620D.

Figure 7B:
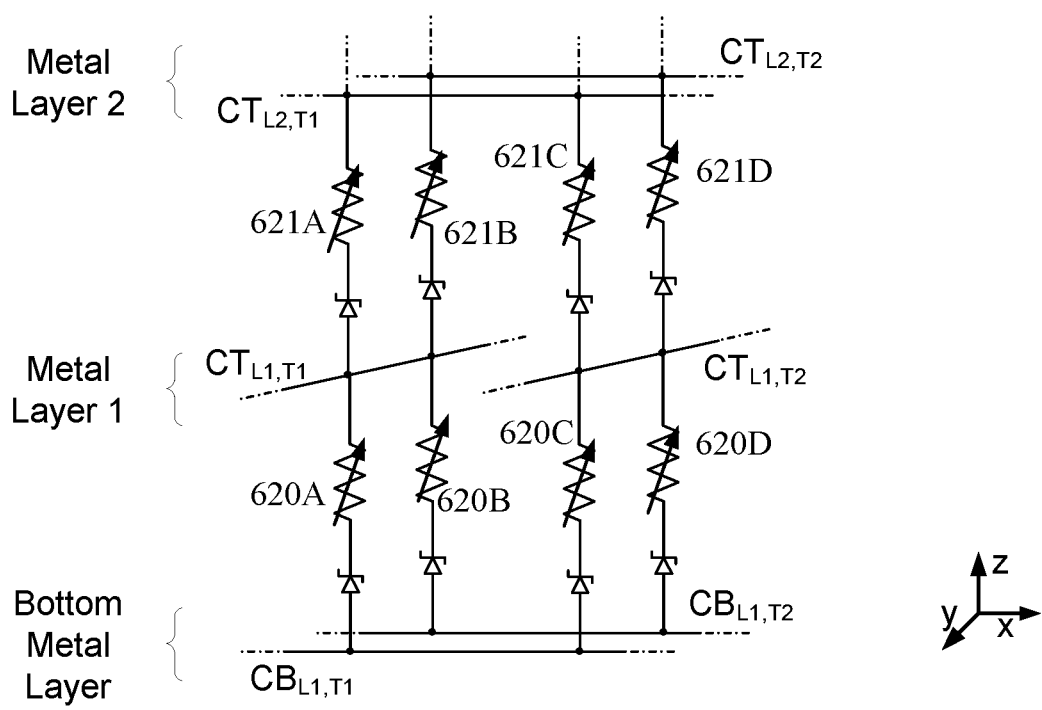
FIG. 7B is a schematic diagram showing an arrangement of stacked compound devices, such as the compound devices illustrated in FIG. 7A, according to an embodiment.

FIG. 7B is a schematic diagram showing an arrangement of stacked compound devices, such as the compound devices illustrated in FIG. 7A, according to an embodiment 750. In the embodiment of FIG. 7B, resistive memory elements 620A, 620B, 620C, and 620D are arranged in a cross point array between two metal layers, such as a bottom metal layer and metal layer 1. In a manner similar to that described with respect to FIG. 7A, common top electrodes $CT_{L1,T1}$ and $CT_{L1,T2}$ of metal layer 1 may operate in combination with common bottom electrodes $CB_{L1,T1}$ and $CB_{L1,T2}$ of the bottom metal layer to read from and to write to one of memory elements 620A, 620B, 620C, and 620D while deselecting the remaining memory elements. Likewise, common top electrodes $CT_{L2,T1}$ and $CT_{L2,T2}$ of metal layer 2 may operate in combination with common top electrodes $CT_{L1,T1}$ and $CT_{L1,T2}$ of metal layer 1 to read from and to write to memory one of memory elements 621A, 621B, 621C, and 621D while deselecting the remaining memory elements.

It should be noted that the arrangement of stacked compound devices of FIG. 7B may be extended to include numerous additional metal layers, such as metal layer 3, metal layer 4, and so forth, up to as many metal layers as wafer fabrication process technologies can support. In one embodiment, for example, the cross point memory arrangement of FIG. 7B may be extended in the "Z" dimension to include a bottom metal layer and 64 metal layers disposed over the bottom metal layer. In addition, the arrangement of stacked compound devices of FIG. 7B may be extended in the "X" and the "Y" dimensions to include additional resistive memory elements and CEM devices in an X-Y plane. In one embodiment, for example, a cross point memory array arrangement that accords with that of FIG. 7B a comprise 64 metal layers and having several million, billions, or any larger number of resistive memory elements coupled in series with CEM devices. It should be noted that claimed subject matter is intended to embrace virtually any two-dimensional or three-dimensional layout of resistive memory elements.

Figure 8:
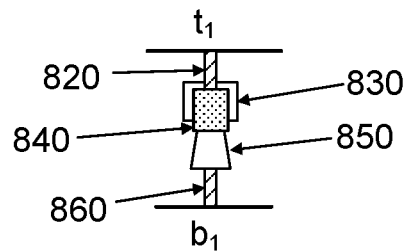
FIG. 8 is an illustration of a resistive memory element implemented on or over a CEM device at a back-end-of-line of a wafer fabrication process according to an embodiment.

FIG. 8 is an illustration of a resistive memory element implemented on or over a CEM device at a back-end-of-line of a wafer fabrication process according to an embodiment 800. Although FIG. 8 illustrates only a single arrangement of a CEM device and resistive memory element, claimed subject matter is intended to embrace a wide variety of arrangements of CEM devices and resistive memory elements. Additionally, although the embodiment of FIG. 8 shows a resistive memory element disposed on a CEM device, claimed subject matter is not limited in this respect. In other embodiments, a CEM device may be disposed on or over a resistive memory element, for example.

In the embodiment of FIG. 8, a CEM device may be fabricated or formed to connect directly with metal layers, such as metal layer $t_1$, which may operate as a wordline as described in reference to FIG. 7A, and metal layer $b_1$, which may operate as a bitline, also as described with reference to FIG. 7A. Conductive via 820 may contact metal layer $t_1$, and may provide electrical connection between conductive via 820 and electrode 830 of resistive memory material 840. Resistive memory material 840 may contact CEM device 850, which may operate as a diode, as previously described herein. CEM device 850 may contact conductive via 860, which may provide electrical connection between CEM device 850 metal layer $b_1$.

FIG. 9 is a flowchart for a method of operating a memory device using a CEM device according to an embodiment 900. Example implementations, such as described in FIG. 9, and any other figures described herein, may include blocks in addition to those shown and described, fewer blocks or blocks occurring in an order different than may be identified, or any combination thereof. The method may begin at block 910, which may comprise applying a voltage signal to a CEM device coupled in series with a resistive memory element. In particular embodiments, a resistive memory element may comprise memory elements that utilize an oxide layer in which an applied voltage signal operates to inhibit movement of charges across a memory element or operates to permit movement of charges across the memory element. In another embodiment, a resistive memory element may correspond to spin-transfer torque magnetic random access memory (STT-MRAM) that utilize tunneling magnetoresistance effect for reading from a memory element and a spin-transfer torque (STT) effect for writing to a memory element. In another embodiment, a resistive memory element may correspond to a nano-RAM memory element in which a memory state may is based, at least in part, on a position of carbon nano tubes.

The method of FIG. 9 may continue at block 920, which may comprise limiting electrical current flow through the CEM device to maintain operation of the CEM device along a region of an impedance profile that is absent a Mott or Mott-like transition. For example, for a CEM device operating in a low-impedance state, responsive to current limiting by, for example, an external circuit element, such as a resistive memory element, may operate to limit and/or constrain a concentration of electrons that may be available to flow through the CEM device.

FIG. 10 is a flowchart for a method of operating a memory device using a CEM device according to an embodiment 1000. Example implementations, such as described in FIG. 10, and any other figures described herein, may include blocks in addition to those shown and described, fewer blocks or blocks occurring in an order different than may be identified, or any combination thereof. The method may begin at block 1010, which may comprise forming one or more resistive memory elements having first terminals and second terminals. In particular embodiments, a resistive memory element may comprise memory elements that utilize an oxide layer in which an applied voltage signal operates to inhibit movement of charges across a memory element or operates to permit movement of charges across the memory element. In another embodiment, a resistive memory element may correspond to spin-transfer torque magnetic random access memory (STT-MRAM) that utilize tunneling magnetoresistance effect for reading from a memory element and a spin-transfer torque (STT) effect for writing to a memory element. In another embodiment, a resistive memory element may correspond to a nano-RAM memory element in which a memory state may is based, at least in part, on a position of carbon nano tubes.

The method of FIG. 10 may continue at block 1020, which may comprise forming a CEM device to be coupled in series with at least one of the one or more resistive memory elements, the CEM device to operate to perform read operations or write operations in a region of an impedance profile that is absent a Mott or Mott-like transition during the read operations or the write operations of the at least one of the one or more resistive memory elements.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact in the absence of an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. An apparatus, comprising:
 a plurality of individually selectable memory devices, wherein at least a subset of the plurality of individually selectable memory devices individually comprise:
  a memory element, and
  a correlated electron material (CEM) device coupled in series with the memory element, wherein the CEM device to operate in a region of an impedance profile that is absent a Mott or Mott-like transition at least during write operations for the memory element.

2. The apparatus of claim 1, wherein a resistance of the memory element operates the CEM device in the region of the impedance profile that is absent the Mott or Mott-like transition at least during the write operations for the memory element.

3. The apparatus of claim 1, wherein the plurality of individually selectable memory devices are arranged in a cross-point array.

4. The apparatus of claim 1, wherein one or more particular memory devices of the plurality of individually selectable memory devices are coupled between one or more particular electrodes of a first metal layer and one or more particular electrodes of a second metal layer.

5. The apparatus of claim 4, wherein the one or more particular electrodes of the first metal layer to be electrically coupled to individual memory elements of the one or more particular memory devices of the plurality of individually selectable memory devices, and wherein the one or more particular electrodes of the second metal layer to be electrically coupled to individual OEM devices of the one or more particular memory devices of the plurality of individually selectable memory devices.

6. The apparatus of claim 5, wherein the individual OEM devices of the one or more particular memory devices of the plurality of individually selectable memory devices to electrically couple the individual memory elements of the one or more particular memory devices of the plurality of individually selectable memory devices between the one or more particular electrodes of the first metal layer and the one or more particular electrodes of the second metal layer during write operations directed to the one or more particular memory devices.

7. The apparatus of claim 5, wherein the one or more particular electrodes of the first metal layer comprise one or more wordlines and wherein the one or more particular electrodes of the second metal layer comprise one or more bitlines.

8. The apparatus of claim 1, wherein the memory element to comprise a spin-transfer torque magnetic memory element or a resistive memory element, or a combination thereof.

9. The apparatus of claim 8, wherein the resistive memory element to comprise a phase change memory element, a conductive bridging memory element or a nanotube memory element, or a combination thereof.

10. A method, comprising:
 limiting a current flow through one or more individually selectable memory devices, the individually selectable memory devices individually comprising a memory element and a correlated electron material (OEM) device, to bring about write operations of the memory element absent a Mott or Mott-like transition in the OEM device.

11. The method of claim 10, wherein the limiting the current flow through the one or more individually selectable memory devices comprises limiting the current flow at least in part via a resistance of the memory element.

12. The method of claim 10, wherein the one or more individually selectable memory devices are coupled between one or more particular electrodes of a first metal layer and one or more particular electrodes of a second metal layer.

13. The method of claim 12, wherein the limiting the current flow through the one or more individually selectable memory devices comprises limiting a current flow between the one or more particular electrodes of the first metal layer and the one or more particular electrodes of the second metal layer at least in part via a current-limiting circuit.

14. The method of claim 12, further comprising applying a particular voltage across the one or more particular electrodes of the first metal layer and one or more particular electrodes of the second metal layer as part of the write operations for the memory element.

15. The method of claim 14, wherein the one or more particular electrodes of the first metal layer to comprise one or more wordlines and wherein the one or more particular electrodes of the second metal layer comprise one or more bitlines.

16. The method of claim 10, wherein the memory element to comprise a spin-transfer torque magnetic memory element or a resistive memory element, or a combination thereof.

17. The method of claim 16, wherein the resistive memory element comprises a phase change memory element, a conductive bridging memory element or a nanotube memory element, or a combination thereof.

18. The method of claim 10, wherein the one or more individually selectable memory devices are arranged in a cross-point array.

19. An array of individually selectable memory devices individually comprising:
   a memory element; and
   a correlated electron material (CEM) device coupled in series with the memory element, wherein a resistance of the memory element to limit current to operate the CEM device absent a Mott or Mott-like transition during write operations for the memory element.

20. The array of individually selectable memory devices of claim 19, wherein the memory element to comprise a resistive memory element or a magnetic memory element, or a combination thereof, and wherein the CEM device to operate as a diode-type device.

* * * * *